(12) United States Patent
Cox

(10) Patent No.: US 7,463,985 B2
(45) Date of Patent: Dec. 9, 2008

(54) ELECTRIC POWER QUALITY INDICATOR DEVICE AND METHOD

(75) Inventor: Roger William Cox, McDonald, PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 11/679,995

(22) Filed: Feb. 28, 2007

(65) Prior Publication Data

US 2008/0208489 A1 Aug. 28, 2008

(51) Int. Cl.
G01R 21/00 (2006.01)
G06F 17/00 (2006.01)

(52) U.S. Cl. .............. 702/60; 702/65; 702/69; 700/293

(58) Field of Classification Search .......... 702/60, 702/61, 65, 69
See application file for complete search history.

(56) References Cited

U.S. PATENT DOCUMENTS

| 5,539,651 | A | * | 7/1996 | Zabar et al. ............... 702/60 |
| 5,587,917 | A | | 12/1996 | Elms |
| 5,600,527 | A | | 2/1997 | Engel et al. |
| 5,627,718 | A | | 5/1997 | Engel et al. |
| 5,706,204 | A | | 1/1998 | Cox et al. |
| 5,825,656 | A | | 10/1998 | Moore et al. |
| 5,890,097 | A | | 3/1999 | Cox |
| 5,899,960 | A | | 5/1999 | Moore et al. |
| 6,005,759 | A | | 12/1999 | Hart et al. |
| 6,269,316 | B1 | | 7/2001 | Hubbard et al. |
| 6,374,188 | B1 | | 4/2002 | Hubbard et al. |
| 6,459,997 | B1 | | 10/2002 | Andersen |
| 6,611,773 | B2 | | 8/2003 | Przydatek et al. |
| 7,050,913 | B2 | | 5/2006 | Cox |
| 7,054,769 | B2 | | 5/2006 | Cox |
| 2004/0024937 | A1 | | 2/2004 | Duncan et al. |
| 2005/0114057 | A1 | * | 5/2005 | Curtis et al. ............... 702/81 |
| 2005/0187725 | A1 | * | 8/2005 | Cox ............................. 702/60 |
| 2005/0273280 | A1 | * | 12/2005 | Cox ............................. 702/60 |

* cited by examiner

*Primary Examiner*—Hal D Wachsman
(74) *Attorney, Agent, or Firm*—Martin J. Moran

(57) ABSTRACT

A system and method of indicating power quality in an electric power system that generates an indication of power quality reflective of the worst observed power quality event over both a short and a long interval of time in which each component of the indicator is weighted by a user programmable factor to control its relative influence.

20 Claims, 3 Drawing Sheets

ELECTRIC POWER QUALITY INDICATOR DEVICE AND METHOD

BACKGROUND OF THE INVENTION

1. Field of the Invention

The invention relates to a system for monitoring the performance of an electric power distribution system, and more particularly, to the generation and presentation of a composite power quality indicator generated from user weighted statistical contributions of various system parameters. The invention also relates to a method of generating and presenting a composite power quality indicator.

2. Background Information

Various instruments for monitoring the performance of electric power systems, including power quality, are known. A wide range of instrumentation measuring individual characteristics, such as RMS currents and voltages, peak currents and voltages, power factor, current and voltage sags and swells, harmonic distortion, flicker and the like, have long been available and are in wide use. Unfortunately, such individual instruments have required vigilant monitoring of a multitude of separate instrument indicators by an operator at an electric power facility with the inevitable result of undesirable electrical events often going unnoticed.

In response to this, power quality monitoring instruments that monitor multiple electrical characteristics have been devised. Some of these instruments attempt to provide an operator with an indication as to whether or not an overall power quality at a given time is normal for a given power system. In these instruments, an overall power quality value representative of what is normal for a given power system is arrived at through statistical analysis of summations of combinations of measurements of some electrical characteristics and quality values assigned to other electrical characteristics over time. This is first done over an initial period (typically a week) and then over a relatively longer period (typically a year). An example of such a power quality monitoring instrument is disclosed in U.S. Pat. No. 7,050,913, incorporated herein by reference.

Unfortunately, the use of a summation of measurements and assigned quality values, even when multiplied by weighting factors to control their relative importance, is susceptible to allowing an indication of a deleterious power quality event indicated by an anomaly in only one of the measurements or assigned values to be missed. Summation is typically more likely to result in a more noticeable indication to an operator of there being a problem when multiple ones of the measurements and/or assigned values simultaneously reflect the occurrence of an undesired power quality event. Also, employing observed electrical characteristics of a power system over time as a basis for determining whether or not a power quality event has occurred is susceptible to allowing one or more measurements and/or assigned values reflecting an undesirable condition to be accepted as normal over time.

SUMMARY OF THE INVENTION

These needs and others are met by embodiments of the invention that monitor power quality in an electric power distribution system and provide an indication of power quality reflective of the worst observed power quality event over both a short and a long interval of time. Each component of this indication is weighted by a user programmable factor to emphasize or de-emphasize its affect.

In accordance with one aspect of the invention, a power quality indicator is for monitoring a power bus including a plurality of electrical characteristics. The power quality indicator comprises a plurality of detectors, each of the detectors being structured to detect an electrical characteristic of the electrical characteristics and to output a value of a plurality of values for each interval of a repeating interval of time, each of the values being structured to indicate a power quality event occurring during a corresponding interval of the repeating interval of time; a data selector structured to receive the values for each interval and to multiply each value of the values for each interval with a corresponding weighting factor of a plurality of weighting factors to provide a corresponding weighted value of a plurality of weighted values for each interval; a power quality selector structured to select one of the weighted values having the largest magnitude of all of the weighted values for each interval; and a display structured to output an indication of the one of the weighted values selected by the power quality selector within a first period of time ending with the most recent interval of the repeating interval of time.

In accordance with another aspect of the invention, a method is for indicating power quality of a power bus including a plurality of electrical characteristics with a plurality of detectors, each detector detecting an electrical characteristic of the electrical characteristics and outputting a value of a plurality of values for each interval of a repeating interval of time, each of the values being structured to indicate a power quality event occurring during a corresponding interval of the repeating interval of time. The method comprises receiving the values for each interval, multiplying each value of the values for each interval with a corresponding weighting factor of a plurality of weighting factors to provide a corresponding weighted value of a plurality of weighted values for each interval, selecting one of the weighted values having the largest magnitude of all of the weighted values for each interval, and outputting an indication of the one of the weighted values selected within a first period of time ending with the most recent interval of the repeating interval of time.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
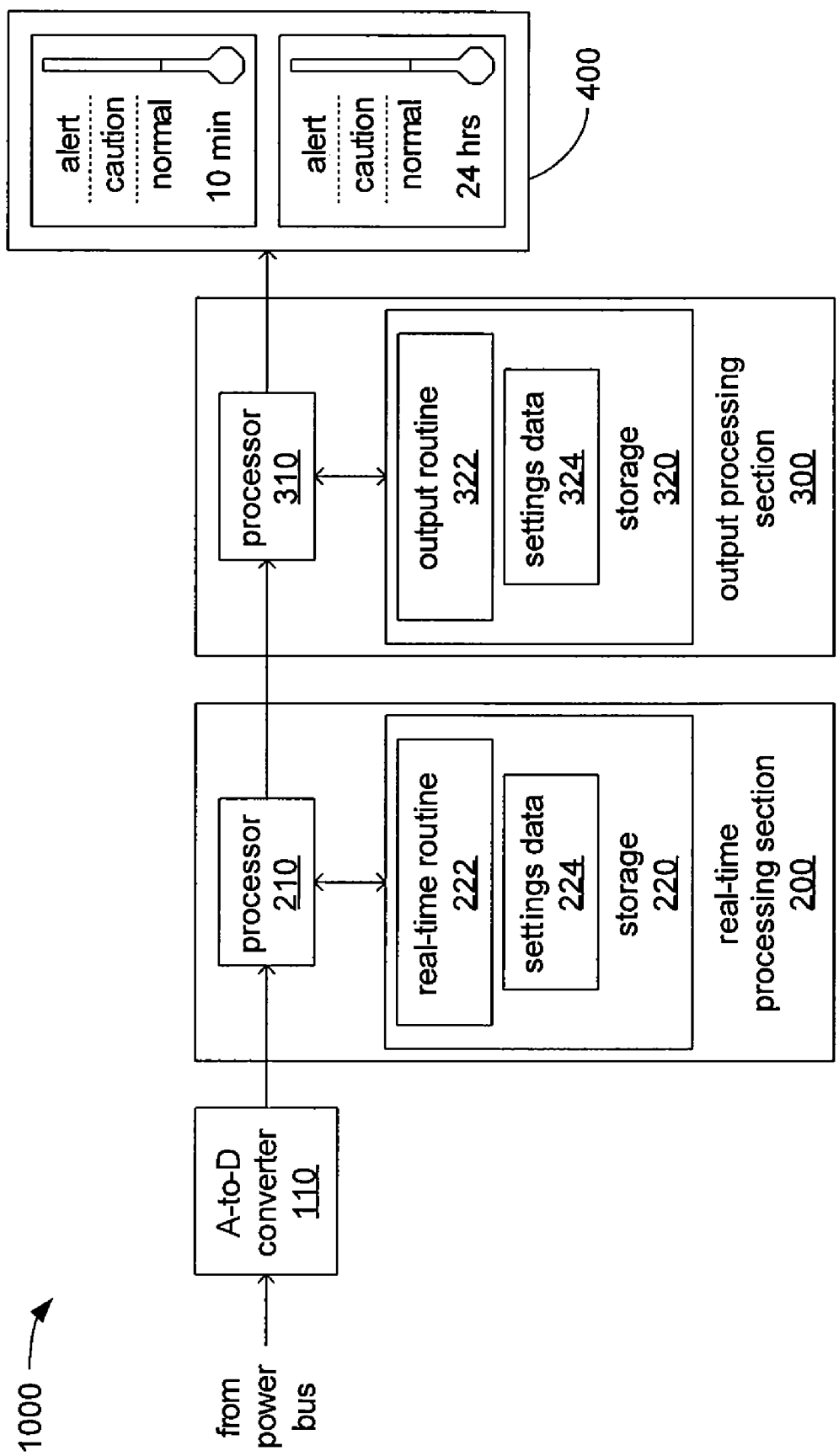
FIG. 1 is a block diagram of a power quality indicator in accordance with embodiments of the invention.

FIG. 1 depicts an embodiment of a power quality indicator 1000 incorporating an A-to-D converter 110, a real-time processing section 200, an output processing section 300 and a display 400. The real-time processing section 200 incorporates a processor 210, and a storage 220 in which at least a real-time routine 222 and settings data 224 are stored. The output processing section 300 incorporates a processor 310, and a storage 320 in which at least an output routine 322 and settings data 324 are stored.

The A-to-D converter 110 is linked to a power bus to receive analog signals indicative of a voltage level and current flow of the power bus. The A-to-D converter 110 receives these analog signals and digitizes them to provide a digitized form of these signals as an input to the processor 210 of the real-time processing section 200. It should be noted that although a single line is used to denote the input to the A-to-D converter 110 from the power bus, the actual quantity of conductors may vary depending on whether the power bus is a single-phase or multi-phase power bus. As those skilled in the art will readily recognize, the linkage of the power bus to the A-to-D converter 110 may take any of a variety of forms, including and not limited to, a suitable analog sensing circuit, such as one or more potential transformers and one or more current transformers.

Within the real-time processing section 200, the processor 210 retrieves and executes a sequence of instructions of the real-time routine 222 causing the processor to receive the digitized form of the analog signals from the A-to-D converter 110. As will be explained in greater detail, the processor 210 is further caused to evaluate electrical characteristics of the power bus as reflected by those signals, and to output results of the evaluation in the form of component values representing components of power quality (PQ) to the processor 310 of the output processing section 300. Within the output processing section 300, the processor 310 retrieves and executes a sequence of instructions of the output routine 322 causing the processor to receive the results of the evaluation of electrical characteristics performed by the processor 210. As will also be explained in greater detail, the processor 310 is further caused to select portions of those results to provide a visual output on the display 400 that indicates the power quality of the power bus.

The processors 210 and 310 may be any of a variety of types of processing device, including, for example, a specialized processor such as a DSP or microcontroller, or a more general function processor such as a processor executing the widely known X86, PowerPC™ or other instruction set. Although the processors 210 and 310 are depicted and described as executing instructions of specific routines, it will be understood by those skilled in the art that one or both of the processors 210 and 310 may also execute instructions of other routines, including routines of operating systems, including and not limited to a variant of Linux®. Preferably, the processor 210 is a DSP and the processor 310 is a general function processor. Furthermore, although two distinct processors, namely the processors 210 and 310, are depicted in FIG. 1 as separately executing instructions for the real-time routine 222 and the output routine 322, alternate embodiments of the power quality indicator 1000 may employ a single processor or multiple processors functioning in parallel to execute a sequence of instructions of a routine combining portions of the real-time routine 222 and the output routine 322.

The storages 220 and 320 are machine readable storage devices that may be made up of volatile and/or non-volatile forms of one or more storage devices including, but not limited to, DRAM, SRAM, ROM, FLASH, EPROM, EEPROM, and magnetic and/or optical machine readable media that may or may not be of a removable form. Although not depicted in FIG. 1, the power quality indicator 1000 may further include an interface enabling one or both of the real-time processing section 200 and the output processing section 300 to be linked to a media storage device and/or a network by which one or both of the real-time routine 222 and output routine 322 may be backed up onto a storage medium, updated (possibly from a storage medium), or otherwise altered.

Figure 2:
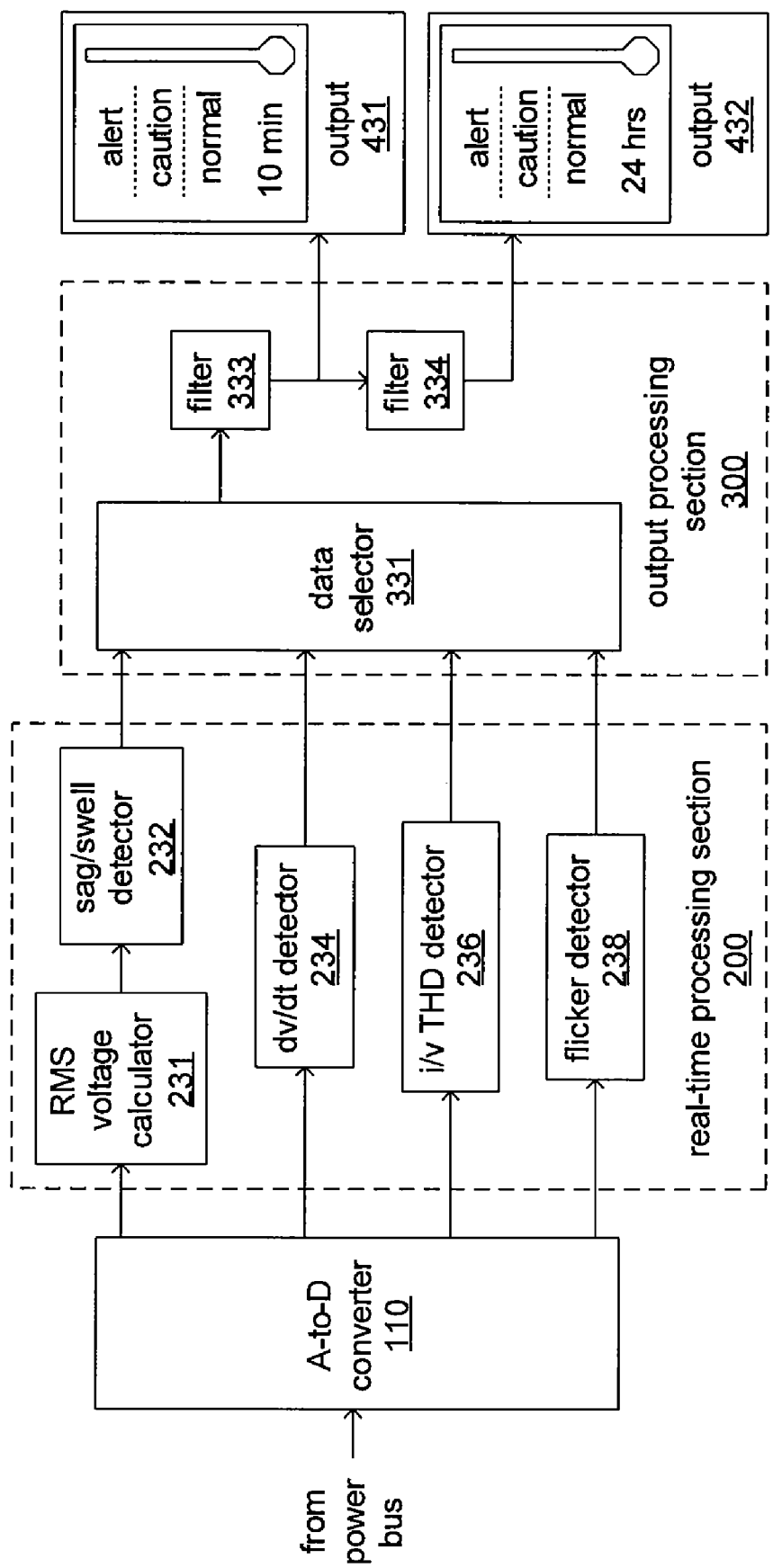
FIG. 2 is another block diagram of a power quality indicator in accordance with another embodiment of the invention.

In executing the real-time routine 222, the processor 210 is caused to implement various detectors depicted in FIG. 2 to perform the aforementioned evaluation of the digitized signals provided to the processor 210 by the A-to-D converter 110. Similarly, in executing the output routine 322, the processor 310 is caused to implement various data selecting and presentation devices also depicted in FIG. 2 to perform the aforementioned output of an indication of the power quality of the power bus. However, although these various detectors and presentation devices are each described and exemplified in FIG. 2 as being implemented by a processor executing instructions of a routine, those skilled in the art will readily recognize that such detectors and/or devices may be implemented in other embodiments with appropriate analog and/or digital circuitry not requiring a processor.

Among the detectors that may be implemented by the processor 210 may be one or more of a sag/swell detector 232, a dv/dt detector 234, a current/voltage (i/v) total harmonic distortion (THD) detector 236 and a flicker detector 238. Among the presentation devices implemented by the processor 310 may be one or more of a data selector 331, a first filter 333 and a second filter 334. The detectors provide values indicative of different electrical characteristics of the power bus on a repeating interval to the data selector 331. In one exemplary embodiment, the duration of the interval that is repeated is 1 second, however, as those skilled in the art will readily recognize, other durations may be employed.

The sag/swell detector 232 receives values representing root-mean-square (RMS) voltages calculated by an RMS voltage calculator 231 from digitized signals received from the A-to-D converter 110. The sag/swell detector 232 uses these RMS voltage values to detect and classify sags and swells in voltage occurring on the power bus. In some embodiments, the sags and swells in voltage are categorized according to the CBEMA/ITIC curve established by the Information Technology Industry Council in 2000, and is disclosed more fully in the earlier-incorporated U.S. Pat. No. 7,050,913. This curve assigns a numerical value for the severity of duration and amplitude of a deviation in the RMS voltage level. A voltage at or near the nominal 100% level has a severity of zero, but an event that approaches the ITIC level is scored as a one. More severe events are scored as two, four, or the highest level of eight. The worst case category of sag and/or swell is recorded for each interval and output to the data selector 331 as a power quality component value.

The dv/dt detector 234 uses digitized signals received from the A-to-D converter 110 to detect and count the number of events during which a rate of change in a voltage (i.e., dv/dt) exceeds a preselected threshold during an interval. The count of the number of such events for each interval is output to the data selector 331 as a power quality component value. It should be noted that other forms of sub-cycle disturbance detector that use wave shape analysis or other forms of analysis may be substituted for the dv/dt detector 234.

The i/v THD detector 236 determines the total harmonic distortion for voltage and current flow of the power bus for each interval. The THD of the voltage is determined as a percentage with respect to a nominal voltage, and the THD of the current is measured as a percentage of full-scale current. A fast Fourier transform is used to determine the THDs of the current and the voltage, which are each expressed as a percentage. Both THDs are averaged over the duration of each interval and those averages are output to the data selector 331 as power quality component values for each interval.

The flicker detector 238 detects and measures instances of short term flicker (Pst) in a voltage of the power bus. Flicker is measured in units of perceptibility in accordance with the EN61000-4-15 standard adopted by standards bodies of European Union countries. The wavelength and other characteristics of an instance of flicker may be compared to a flicker curve where reaching a point along the curve results in a Pst measured in units of perceptibility of 1. The flicker detector 238 generates and uses a histogram to calculate the short-term perceptibility (Pst) of flicker for each interval, which is output to the data selector 331 as a power quality component value for each interval.

In carrying out each of their functions, one or more of the sag/swell detector 232, the dv/dt detector 234, the i/v THD detector 236, and the flicker detector 238 may employ one or more settings that may be configurable by an operator of the power quality indicator 1000. These settings may include, without limitation, a parameter for or a selection of a curve employed by the sag/swell detector 232, or the preselected threshold employed by the dv/dt detector 234. In such embodiments, such settings may be maintained as the settings data 224 stored in the storage 220 depicted in FIG. 1.

The data selector 331 receives the component values output by each of the sag/swell detector 232, the dv/dt detector 234, the i/v THD detector 236 and the flicker detector 238 for each interval. For each interval, the data selector 331 selects whichever one of the component values that has the largest magnitude for output to the first filter 333. In some embodiments, the data selector 331 allows an operator of the power quality indicator 1000 to set weighting factors by which each of the component values received from the detectors are individually multiplied to provide weighted values. The weighting factors allow the relative importance of the each of the component values to be selected such that the data selector 331 selects whichever one of the weighted values that has the largest magnitude for output to the first filter 333. In such embodiments, the weighting factors may be maintained as the settings data 324 stored in the storage 320 depicted in FIG. 1. In one exemplary embodiment, the weighting factors may each be set to values within a range 0% to 500%, however, other implementations of the weighting factors are possible, as those skilled in the art will readily recognize.

The two filters 333 and 334 are single-pole low-pass filters used to present the magnitude of detected power quality problems initially at the full magnitude of the problem, but then decaying in magnitude over time in recognition of the reduction of importance that a given power quality event is likely to have as time passes from its occurrence. In some embodiments, the first filter 333 stores any non-zero value received from the data selector 331 in a manner in which that value decays to 0 within, by way of example, a 10 minute decay period. This decaying value is output on the display 400 as a graphical output 431, and is also provided to the second filter 334. In turn, the second filter 334 stores any non-zero value received from the first filter 333 in a manner in which that value decays to 0 within, by way of example, a 24 hour decay period. This decaying value is output on the display 400 as a graphical output 432.

In a preferred embodiment, the decay of non-zero values initially stored in the two filters 333 and 334 are decayed at an exponentially decreasing rate (e.g., and without limitation, a form of decay in which the stored value is repeatedly halved over time). The decaying effect of both the filters 333 and 334 is overcome with the receipt, within the period of decay, of another non-zero value received from the data selector 331 during a later interval that could indicate that the same electrical event on the power bus is continuing to be detected, or that a different electrical event has been detected, or both. This additional non-zero value is added to whatever non-zero value is already stored within the first filter 333 from the decay of the previous non-zero value, and the total becomes the new value initially stored in that filter 333 and displayed in the output 431, before being decayed. This same total is also relayed to the second filter 334 where this total is added to whatever non-zero value may still be stored in that filter 334, thereby possibly providing a greater total that is initially stored in the filter 334 and displayed in the output 432, before being decayed.

In a preferred embodiment, the outputs 431 and 432 display the values that are stored and decayed by the two filters 333 and 334, respectively, as a level on a scale on which ranges of values are denoted as being the "caution" or "alert" ranges meant to aid in conveying the severity of an electrical event. In other embodiments, the stored and decayed values may be presented as numerical digits. The use of a decaying effect is meant to place greater emphasis on more recent electrical events that adversely effect power quality. Emphasis on more recent electrical events is also provided through the provision of the output 431 with a relatively short decay time that is measurable in minutes alongside the output 432 with a much longer decay time that is measurable in hours. An operator who observes an indication of poor power quality is thereby prompted to retrieve more detailed records to determine the exact nature and extent of the electrical event(s) that lead to the poor power quality.

By way of example presented for purposes of illustration, an electrical event occurs on the power bus such that there is a minor instance of flicker occurring within a single interval. Referring to FIGS. 1 and 2, analog signals representative of current flow and voltage on the power bus are received by the A-to-D converter 110, and those signals are digitized and presented as inputs to the processor 210 of the real-time processing section 200. Within the real-time processing section, the flicker detector 238 implemented by the processor 210 detects and measures the instance of flicker occurring within a single interval (e.g., and without limitation, a 1-second interval). The flicker detector 238 outputs a component value to the processor 310 of the output processing section 300 that is indicative of there having been a instance of flicker during that single interval and that is indicative of the magnitude of the flicker.

Within the output processing section 300, the data selector 331 implemented by the processor 310 multiplies each of the value components received from the various detectors implemented by the processor 210 with weighting factors corresponding to each of the component values to provide weighted values. Then, presuming that the resulting weighted value representing flicker has the largest magnitude of all of the weighted values for that interval, the weighted value representing flicker in that interval is selected and output by the data selector to the first filter 333. That filter 333 initially stores the selected weighted value and relays that weighted value to the display 400 as part of the output 431 causing the non-zero weighted value to be graphically shown as having possibly raised the displayed level of the indicator in the output 431 to either the "caution" or "alert" ranges. However, the first filter 333 also decays the weighted value stored in that filter 333. Over time, the displayed level falls and returns to the "normal" range if no more non-zero values of sufficient magnitude to raise the displayed level higher are received by the first filter 333 during the period of decay.

Figure 3:
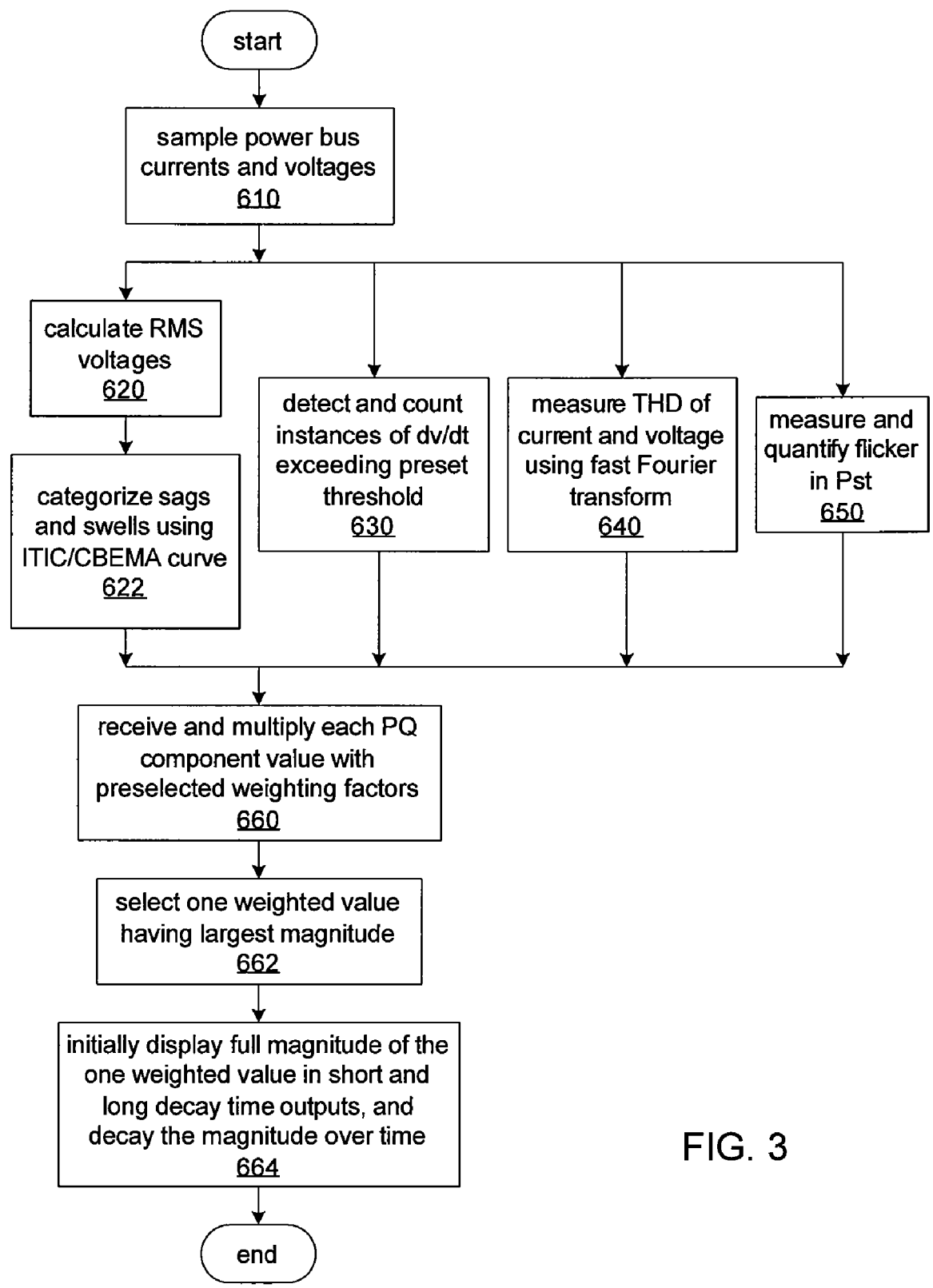
FIG. 3 is a flowchart of an approach to indicating power quality in accordance with still another embodiment of the invention.

FIG. 3 shows an exemplary procedure for providing an indication of power quality. At 610, current flows and voltage of a power bus are sampled. At 620, RMS voltages are calculated from the voltage samples and the RMS voltages are used to categorize sags and/or swells occurring on the power bus during each interval of a repeating interval using an ITIC/CBEMA curve at 622. At 630, voltage samples are used to detect and count instances of dv/dt exceeding a preselected threshold occurring on the power bus during each interval. At 640, both current flow and voltage samples are used to measure the THD of both current flow and voltage on the power bus during each interval. At 650, voltage samples are used to measure and quantify instances of flicker occurring on the power bus during each interval.

It should be noted that the events at 620, 622, 630, 640 and 650 occur substantially simultaneously and repeatedly for each interval. At 660, values indicative of sags and/or swells, instances of excessive dv/dt, THD for current and voltage, and instances of flicker for each interval are each received as component values of power quality. Each of these component values is multiplied by a corresponding weighting factor to provide a corresponding weighted value. As previously discussed, the weighting factors may be selected to give relatively greater emphasis to one or more component values over the others. At 662, one weighted value having the largest magnitude of all of the weighted values for a given interval is selected to be indicative of the power quality for that interval.

At 664, the full magnitude of the one weighted value is initially displayed in an output where that magnitude is then decayed over a period of time. As previously discussed, if the output already displays a non-zero value indicative of a power quality event from an earlier interval, then the full magnitude of the one weighted value is initially displayed by adding that magnitude to whatever non-zero value remains as a result of being decayed, and that combined new value is decayed over the period of time.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A power quality indicator for monitoring a power bus including a plurality of electrical characteristics, the power quality indicator comprising:

a plurality of detectors, each of the detectors being structured to detect an electrical characteristic of the electrical characteristics and to output a component value of a plurality of component values for each interval of a repeating interval of time, each of the component values being structured to indicate a power quality event occurring during a corresponding interval of the repeating interval of time;

a data selector structured to receive the component values for each interval and to multiply each component value of the component values for each interval with a corresponding weighting factor of a plurality of weighting factors to provide a corresponding weighted value of a plurality of weighted values for each interval, and further structured to select one of the weighted values having the largest magnitude of all of the weighted values for each interval; and a display structured to output an indication of the one of the weighted values selected by the data selector within a first period of time ending with the most recent interval of the repeating interval of time.

2. The power quality indicator of claim 1, wherein the detectors include a first processor and a first storage in which a first sequence of instructions is stored that when executed by the first processor causes the first processor to detect the electrical characteristic of the electrical characteristics and to output the component value of the component values for each interval of the repeating interval of time.

3. The power quality indicator of claim 2, wherein the first processor is a digital signal processor.

4. The power quality indicator of claim 1, wherein the detectors include a sag/swell detector.

5. The power quality indicator of claim 1, wherein the detectors include a dv/dt detector.

6. The power quality indicator of claim 1, wherein the detectors include a total harmonic distortion detector.

7. The power quality indicator of claim 1, wherein the detectors include a flicker detector.

8. The power quality indicator of claim 1, wherein the data selector includes a processor and a storage in which a sequence of instructions is stored that when executed by the processor causes the processor to:

receive the component values for each interval;

multiply each component value of the component values for each interval with the corresponding weighting factor to provide the corresponding weighted value for each interval; and select the one of the weighted values for each interval.

9. The power quality indicator of claim 8, wherein the corresponding weighting factor is programmable and is stored in the storage.

10. The power quality indicator of claim 8, wherein the processor implements a filter structured to cause the display to output the indication initially with a level reflecting the largest magnitude with the level decaying to zero during the first period of time.

11. The power quality indicator of claim 1, wherein the display is further structured to output the one of the weighted values selected by the data selector within a different second period of time, the different second period of time being greater than the first period of time and the first period of time being within the different second period of time.

12. A method of indicating power quality of a power bus including a plurality of electrical characteristics with a plurality of detectors, each detector detecting an electrical characteristic of the electrical characteristics and outputting a component value of a plurality of component values for each interval of a repeating interval of time, each of the component values being structured to indicate a power quality event occurring during a corresponding interval of the repeating interval of time, the method comprising:

receiving the component values for each interval;

multiplying each component value of the component values for each interval with a corresponding weighting factor of a plurality of weighting factors to provide a corresponding weighted value of a plurality of weighted values for each interval;

selecting one of the weighted values having the largest magnitude of all of the weighted values for each interval; and outputting an indication of the one of the weighted values selected within a first period of time ending with the most recent interval of the repeating interval of time.

13. The method of claim 12, further comprising retrieving and executing a first sequence of instructions to cause a first processor to detect the electrical characteristics and to output the component values for each interval.

14. The method of claim 12, wherein the electrical characteristics include a count of sags and a count of swells during each interval.

15. The method of claim 12, wherein the electrical characteristics include a change in voltage over a unit of time occurring during each interval.

16. The method of claim 12, wherein the electrical characteristics include total harmonic distortion in current and total harmonic distortion in voltage during each interval.

17. The method of claim 12, wherein the electrical characteristics include a count of occurrences of flicker during each interval.

18. The method of claim 12, further comprising retrieving and executing a sequence of instructions to cause a processor to receive the component values for each interval, multiply each component value of the component values for each interval with the corresponding weighting factor to provide the corresponding weighted value for each interval, and select the one of the weighted values for each interval.

19. The method of claim 12, further comprising outputting the indication initially with a level reflecting the largest magnitude with the level decaying to zero during the first period of time.

20. The method of claim 12, further comprising outputting an indication of one of the weighted values having the largest magnitude of all of the weighted values for each interval occurring within a different second period of time, the different second period of time being greater than the first period of time and the first period of time being within the different second period of time.

* * * * *